United States Patent [19]

Saito

[11] Patent Number: 5,512,746
[45] Date of Patent: Apr. 30, 1996

[54] MICRO-PATTERN MEASURING APPARATUS

[75] Inventor: Tsuyoshi Saito, Tokyo, Japan

[73] Assignee: Kabushiki Kaisha Toshiba, Kanagawa, Japan

[21] Appl. No.: 309,660

[22] Filed: Sep. 21, 1994

[30]    Foreign Application Priority Data

Sep. 22, 1993  [JP]  Japan .................... 5-236840

[51] Int. Cl.⁶ ................................ G01N 23/225
[52] U.S. Cl. ................ 250/310; 250/306; 250/251
[58] Field of Search .................... 250/310, 306, 250/251, 492.3

[56]          References Cited

U.S. PATENT DOCUMENTS

| 4,567,364 | 1/1986 | Kano et al. | 250/310 |
| 4,910,398 | 3/1990 | Komatsu et al. | 250/310 |
| 4,992,661 | 2/1991 | Tamura et al. | 250/310 |
| 5,241,186 | 8/1993 | Yunogami et al. | 250/310 |
| 5,256,876 | 10/1993 | Hazaki et al. | 250/310 |

FOREIGN PATENT DOCUMENTS 2-91507   3/1990   Japan .

*Primary Examiner*—Jack I. Berman
*Assistant Examiner*—Kiet T. Nguyen
*Attorney, Agent, or Firm*—Finnegan, Henderson, Farabow, Garrett & Dunner

[57]            ABSTRACT

A scanning electron microscope scans a sample with an electron beam in a transverse direction, to measure the size of the sample. The microscope has an electron gun for emitting an electron beam, a scan coil and an electron lens for periodically deflecting the electron beam, a detector for detecting a secondary electron signal, a unit for measuring the size of the sample according to the secondary electron signal and displaying the sample, and a probe for catching charged electrons on the sample. This microscope correctly measures the size of a sample that is made of easily-charged material such as photoresist or insulation material.

20 Claims, 7 Drawing Sheets

MICRO-PATTERN MEASURING APPARATUS

BACKGROUND OF THE INVENTION

1. Field of the Invention

The present invention relates to a micro-pattern measuring apparatus such as an SEM (scanning electron microscope) for measuring the size of a micro pattern formed on a semiconductor device such as an LSI, a VLSI, or a ULSI. In particular, the present invention relates to an in-line process monitor for measuring the size of a micro pattern during manufacturing processes of semiconductor devices.

2. Description of the Prior Art

FIG. 1 shows a conventional SEM employing an electron beam to measure the size of a micro pattern formed on a semiconductor device such as a VLSI. A semiconductor substrate (wafer) 101 has a micro pattern 102. The SEM emits a thin electron beam 103 to the pattern 102, receives a secondary electron signal from the pattern 102, and generates a luminance modulation signal for a CRT (cathode ray tube) according to the intensity of the secondary electron signal, to display an image of the pattern 102 on the CRT in synchronization with the scanning of the pattern 102 with the electron beam 103. Then, the size of the pattern 102 is measured on the displayed image of the pattern 102.

If the micro pattern 102 is made of material that causes no charge-up phenomenon, there will be no problem. When the pattern 102 is made of photoresist or insulation material such as silicon, silicon oxide ($SiO_2$), or silicon nitride ($Si_3N_4$), the charge-up phenomenon occurs. FIG. 2 shows the secondary electron signal from the micro pattern 102. This signal has a slope 104A corresponding to a left edge 102A of the pattern 102, and a slope 104B corresponding to a right edge 102B of the pattern 102. Since the slopes 104A and 104B are asymmetrical, it is impossible to correctly detect the right edge 102B. This problem also occurs even if wiring material is silicide or aluminum, if the material is covered with photoresist or insulation material. The micro pattern 102 covered with photoresist or insulation material such as silicon oxide causes the charge-up phenomenon when the electron beam 103 irradiates the right edge 102B of the pattern 102 and a plain area 104. Consequently, the signal's slope 104B corresponding to the right edge 102B of the pattern 102 becomes dull as encircled in FIG. 2, and the slopes 104A and 104B become asymmetrical. This results in erroneously detecting the right edge 102B, to incorrectly measure the size of the pattern 102. To avoid the charge-up phenomenon, prior-art techniques generate an electron beam with a reduced acceleration voltage or with a reduced current quantity, or deposit metal thin film over the pattern 102.

Reducing the acceleration voltage, however, lowers the intensity of the electron beam or increases the diameter thereof, to thereby deteriorate resolution. Similarly, reducing the electron beam current deteriorates the S/N ratio of a secondary electron signal. Namely, the acceleration voltage or the electron beam current must not be decreased too low. Depositing metal over the micro pattern 102 will hide, damage, or deform microstructures on the substrate 101. The charge-up phenomenon frequently causes measurement trouble because recent technology provides very fine patterns and complicated structures. When a measurement object is a hole surrounded by photoresist, the charge-up phenomenon is easily caused by charged electrons that have no place to escape, to make the hole unmeasurable.

Depositing a metal thin film such as a silver thin film over a measurement object causes a contamination problem later. Accordingly, this technique is improper for the in-line measurement of micro patterns.

SUMMARY OF THE INVENTION

An object of the present invention is to provide a micro-pattern measuring apparatus capable of accurately measuring the size of a micro pattern without depositing metal thin film even if the micro pattern is made of photoresist, silicon, or insulation material.

Another object of the present invention is to provide a micro-pattern measuring apparatus that is capable of accurately measuring the size of a micro pattern without damaging or contaminating the surface of the sample.

Still another object of the present invention is to provide a scanning electron microscope having a unit for removing charged electrons from the surface of a sample, and capable of freely setting an acceleration voltage applied to an electron gun.

In order to accomplish the objects, the present invention provides a scanning electron microscope (SEM) shown in FIG. 3. The SEM has an electron gun 12, an electron optical system 10, and a detector 20. The electron optical system 10 includes a scan coil 15 for scanning a sample 16 with an electron beam VM from the electron gun 12, and an electron lens 14. The detector 20 detects a secondary electron signal from the sample 16. This SEM differs from a general SEM in that it has a probe 18 for removing charged electrons from the sample 16.

The probe 18 is in contact with the sample 16, to remove charged electrons therefrom. Alternatively, the probe 18 is slightly spaced from the sample 16, and a high electric field is applied to the probe 18 to remove charged electrons from the sample 16. Once the charged electrons are removed, the charge-up phenomenon that causes asymmetry in the secondary electron signal will never occur. Accordingly, it is not necessary to lower an acceleration voltage applied to the electron gun 12. Namely, the size of the object 16 is measurable with a proper acceleration voltage for required resolution.

This SEM is capable of precisely measuring, during manufacturing processes, the size of a micro pattern formed on a semiconductor substrate (wafer) without damaging or contaminating the surface of the substrate even if the substrate is covered with photoresist or an insulation film. The probe 18 is moved along X, Y, and Z axes by a fine-adjustment drive unit 19. The probe 18 may be continuously in contact with the substrate at a position where the probe 18 can remove charged electrons without influencing the electron beam VM. Alternatively, the probe 18 is made in contact with the substrate in the vicinity of a scan line of the electron beam VM only between scanning periods as shown in FIG. 6. Positive potential may be applied to the probe 18 to more effectively remove charged electrons.

Other and further objects and features of this invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Figure 1:
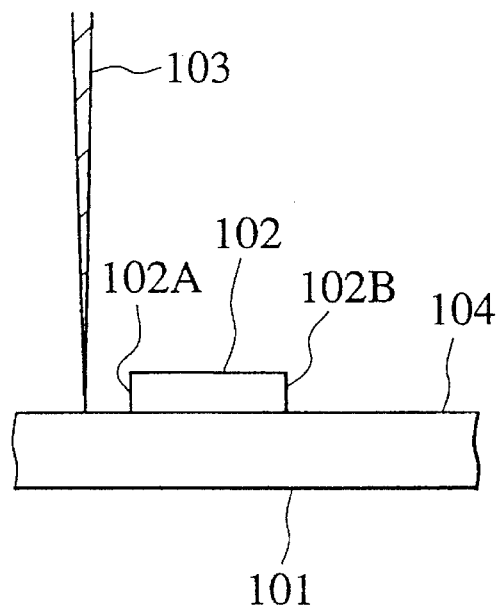
FIG. 1 shows a sample and an electron beam according to a prior art.
Figure 2:
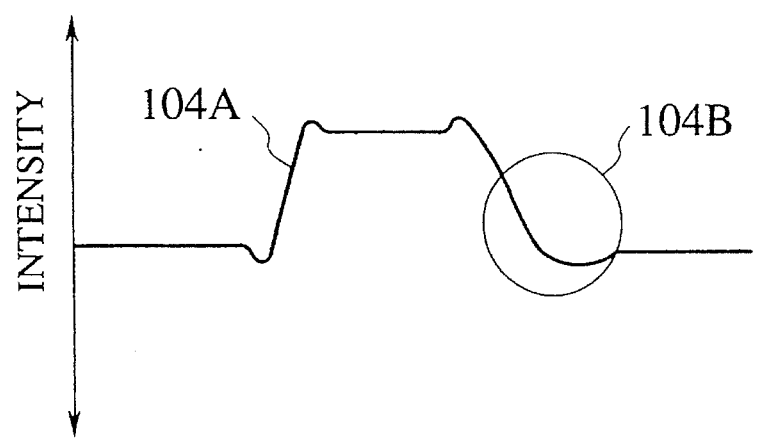
FIG. 2 shows a waveform of a secondary electron signal according to the prior art.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

Figure 3:
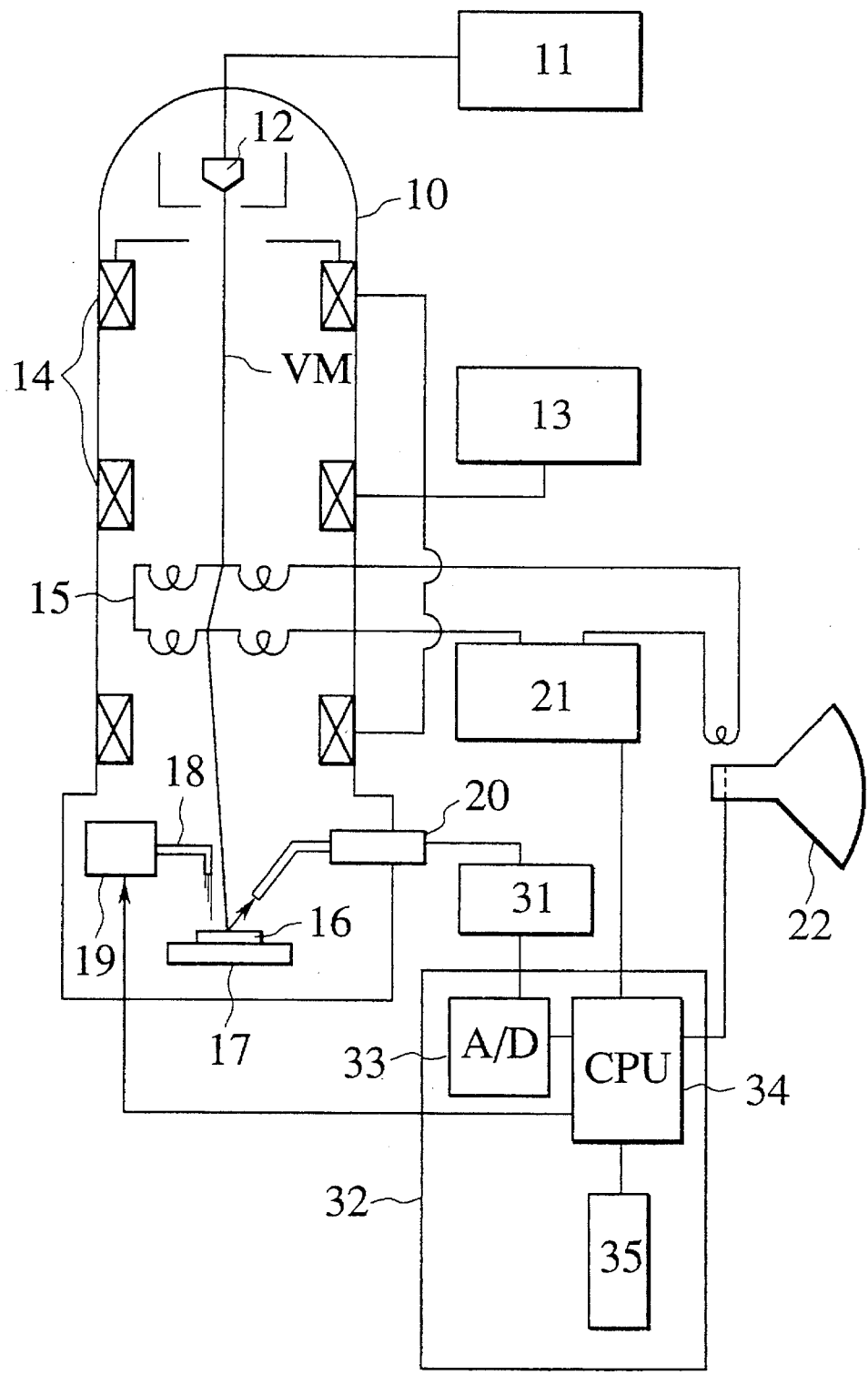
FIG. 3 shows a micro-pattern measuring apparatus according to a first embodiment of the present invention.

FIG. 3 shows a micro-pattern measuring apparatus according to the first embodiment of the present invention. The apparatus has a vacuum container 10. An acceleration voltage source 11 is connected to an electron gun 12, which is disposed at the top of the container 10. The electron gun 12 may be of thermoionic emission type employing a W hairpin filament or a lanthanum hexaboride ($LaB_6$) point cathode, or of field emission type. The latter is preferable for a low acceleration voltage. A lens voltage source 13 supplies a lens current to an electron lens 14, which is attached to the sidewall of a hollow of the container 10. A scan coil 15 is arranged in the middle of the hollow of the container 10. The electron lens 14 and scan coil 15 form an electron optical system. A semiconductor substrate (wafer) 16 to be measured is placed on a sample table 17 at the bottom of the container 10. A conductive probe 18 is fitted to a drive unit 19, which is arranged in the vicinity of the sample table 17, so that the probe 18 gets in contact with the surface of the substrate 16. A secondary-electron-signal detector 20 is arranged in the vicinity of the sample table 17. The drive unit 19 is finely movable in horizontal and vertical directions along axes X, Y, and Z. In response to an acceleration voltage from the acceleration voltage source 11, the electron gun 12 emits an electron beam VM, which irradiates the substrate 16 through the electron lens 14. At this time, the scan coil 15 forms magnetic fields to periodically deflect the electron beam VM, so that the electron beam VM scans the substrate 16. The scan coil 15 periodically receives a scan current from a scan current source 21, which supplies the scan current to a CRT 22 too. Due to the electron beam VM, the substrate 16 generates a secondary electron signal. The signal is detected by the detector 20, is amplified by an amplifier 31, and is passed to a CPU 34 through an A/D converter 33 of an operation controller 32. The CPU 34 is connected to a memory 35, the scan current source 21, and the drive unit 19. Accordingly, the operation of the drive unit 19, which is characteristic to the present invention, is automatically controlled by the CPU 34, to vertically or horizontally move the probe 18.

Figure 4A:
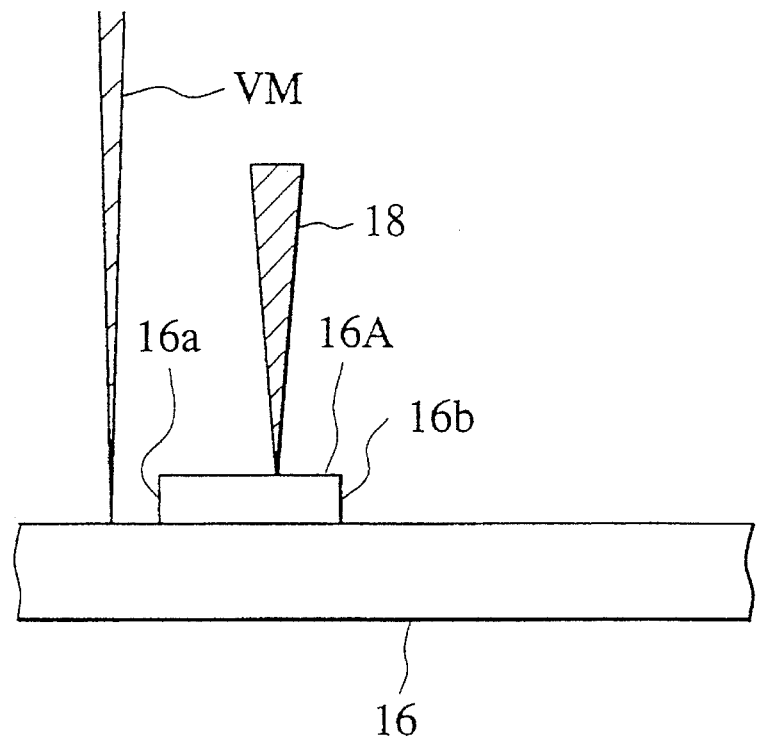
FIG. 4A is a sectional view taken along a scan line for measuring a micro pattern according to the first embodiment.
Figure 4B:
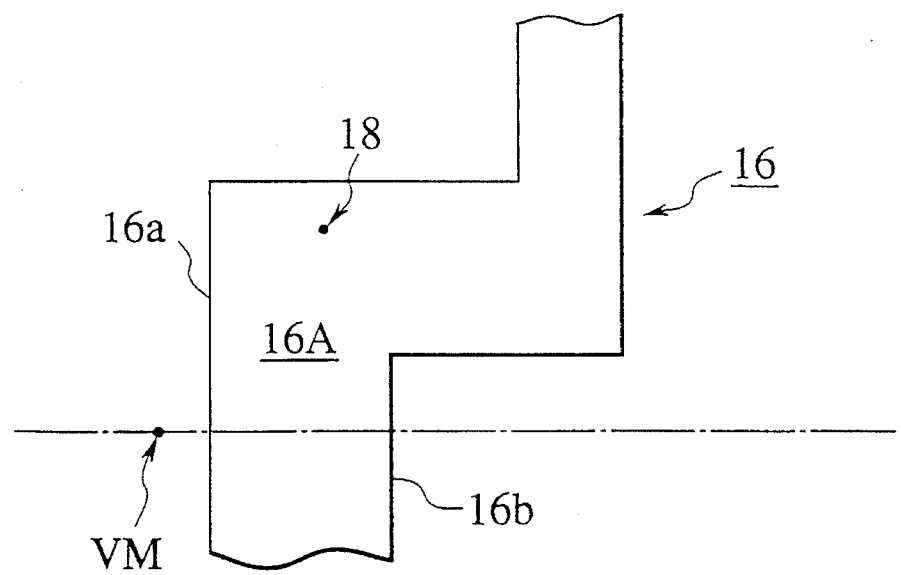
FIG. 4B is a plan view showing a sample to be measured according to the first embodiment.

FIG. 4 shows a micro pattern 16A formed on the substrate 16. The size of the micro pattern 16A is going to be measured. Before the electron gun 12 emits the electron beam VM, the CPU 34 so controls the drive unit 19 that the probe 18 gets in contact with the surface of the micro pattern 16A in the vicinity of a measurement line, i.e., a scan line, as shown in FIG. 4B.

In FIG. 4B, a dot-and-dash line indicates the scan line of the electron beam VM. It must be noted that the electron beam VM and probe 18 are not on the same plane. The acceleration voltage source 11 applies an acceleration voltage of, for example, 1000 V to the electron gun 12, which then emits the electron beam VM. The electron beam VM is periodically deflected by the scan coil 15, to scan the micro pattern 16A as indicated with the dot-and-dash line in FIG. 4B.

Figure 5:
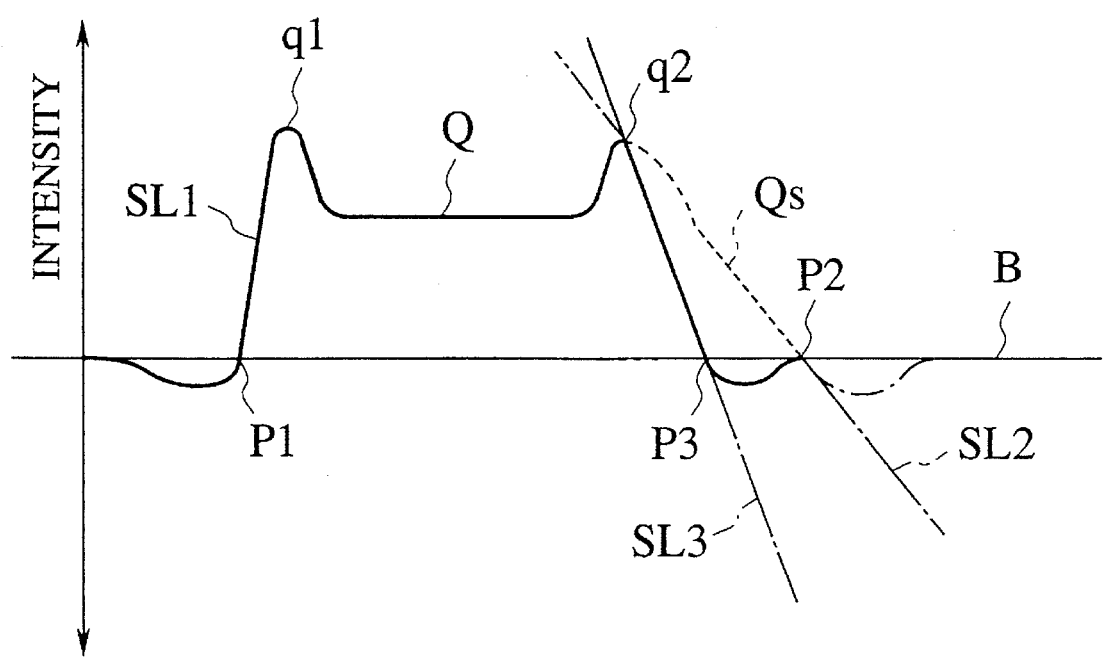
FIG. 5 shows a waveform of a secondary electron signal according to the present invention.

At this time, the micro pattern 16A generates a secondary electron signal having a waveform Q indicated with a continuous line in FIG. 5. The waveform Q is left-right symmetrical. The waveform Q falls below a base line B at first and then steeply rises to form a slope SL1. After the slope SL1, the waveform Q reaches a peak q1, falls a little, and settles into a constant value. An intersection P1 between the base line B and the slope SL1 corresponds to a left edge 16a of the micro pattern 16A. After the constant value, the waveform Q slightly rises to a peak q2 and falls along a slope SL3 to the base line B. An intersection P3 between the base line B and the slope SL3 corresponds to a right edge 16b of the micro pattern 16A.

In this way, the secondary electron signal shows the left-right symmetrical waveform Q. This symmetry is realized when the probe 18 gets in contact with the micro pattern 16A on the substrate 16, to remove excessive charged electrons from the micro pattern 16A and thus prevent the charge-up phenomenon.

Unlike the present invention, the conventional measuring apparatus leaves the excessive charged electrons intact on the micro pattern 16A, to cause the charge-up phenomenon. As a result, a portion of the secondary electron signal corresponding to the right edge 16b of the micro pattern 16A becomes dull as indicated with a dotted line Qs in FIG. 5. The waveform Qs is asymmetrical due to the charge-up phenomenon.

The prior art detects the left edge 16a of the micro pattern 16A at the intersection P1 between the slope SL1 and the base line B, and the right edge 16b thereof at an intersection P2 between the base line B and a slope SL2 of the waveform Qs. The slope SL2 of the prior art, however, outwardly deviates from the original slope SL3 due to the asymmetrical waveform Qs that is dull at the right edge 16b. Accordingly, the intersection P2 is incorrect as the position of the right edge 16b. The prior art, therefore, is incapable of correctly measuring the size of the micro pattern 16A.

On the other hand, the measuring apparatus according to the first embodiment of the present invention removes charged electrons from the micro pattern 16A through the probe 18, to provide the original slope SL3, to correctly detect the right edge 16b of the micro pattern 16A at the intersection P3 between the slope SL3 and the base line B. Consequently, the first embodiment correctly measures the size of the micro pattern 16A.

In practice, the electron beam VM scans the micro pattern 16A several times, and an integration of the several times of scanning is displayed on the CRT 22. The probe 18 may be made in contact with the micro pattern 16A only between the scanning periods of the electron beam VM as shown in FIG.

Figure 6:
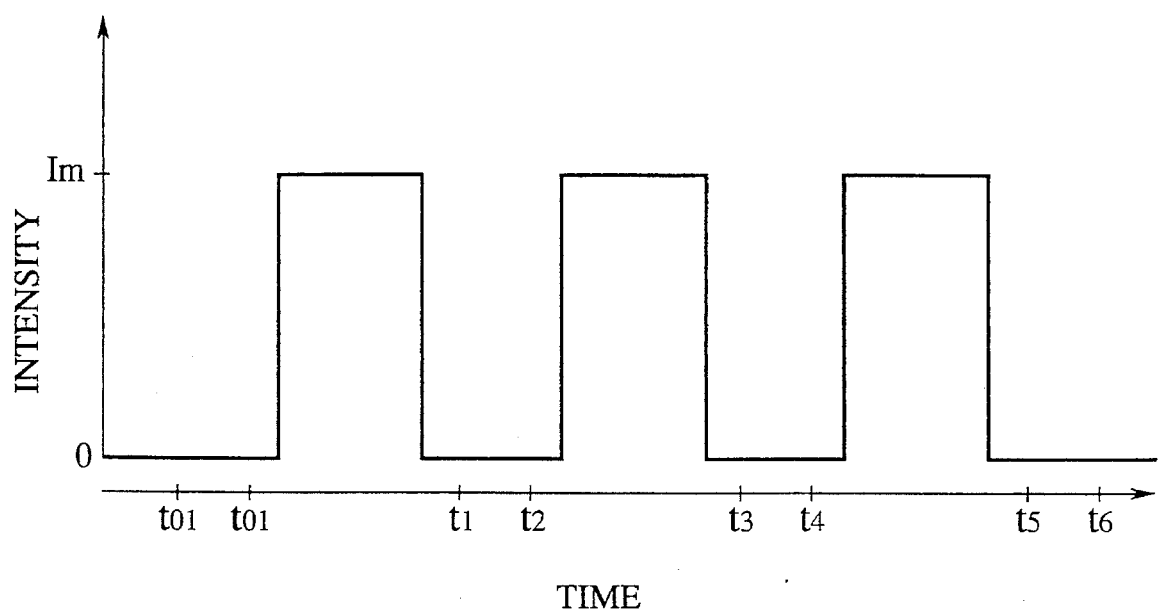
FIG. 6 shows the relationship between the intensity of an electron beam and time.

6. In this case, the probe 18 is moved away from the electron beam VM during the scanning periods. In FIG. 6, an abscissa represents time, and an ordinate represents the intensity of the electron beam VM. The probe 18 may be made in contact with the scan line indicated with the dot-and-dash line in FIG. 4B. For example, the probe 18 will be in contact with the scan line in a period between t1 and t2, in a period between t3 and t4, in a period between t5 and t6, and so on.

Figure 7:
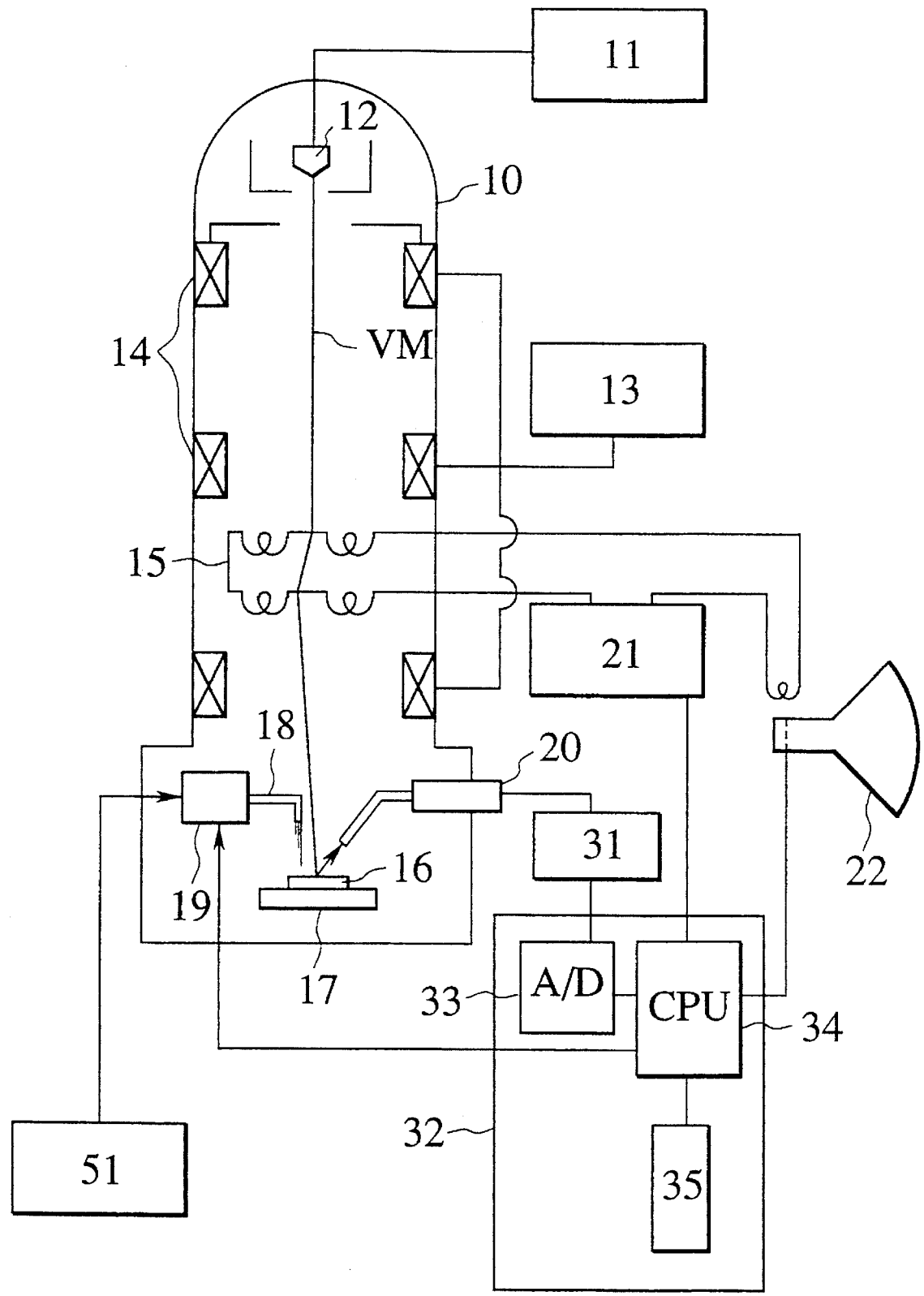
FIG. 7 shows a micro-pattern measuring apparatus according to a second embodiment of the present invention.

FIG. 7 shows a micro-pattern measuring apparatus according to the second embodiment of the present invention. The first embodiment mentioned above removes excessive electrons by bringing the probe 18 directly in contact with the surface of the micro pattern 16A on the semiconductor substrate 16. If the micro pattern 16A is coated with, for example, photoresist, the mechanical contact between the probe 18 and the micro pattern 16A will cause a flaw or a pinhole on the photoresist, to deteriorate the yield of the substrate (wafer) 16. Accordingly, the second embodiment indirectly removes excessive electrons from the micro pattern 16A through the probe 18.

In addition to the components of the first embodiment, the second embodiment employs a direct-current (DC) voltage source 51 for generating a DC voltage of, for example, 5000 V. The probe 18 is spaced from the micro pattern 16A by about 30 micrometers. The DC voltage source 51 applies a positive voltage of 5000 V to the probe 18 between the scanning periods of an electron beam VM. Namely, the positive potential is applied in a period between t1 and t2, in a period between t3 and t4, in a period t5 and t6, and so on in FIG. 6, to remove excessive electrons from the micro pattern 16A through the probe 18 and prevent the charge-up phenomenon. Consequently, the second embodiment correctly measures the size of the micro pattern 16A, similar to the first embodiment.

Figure 8:
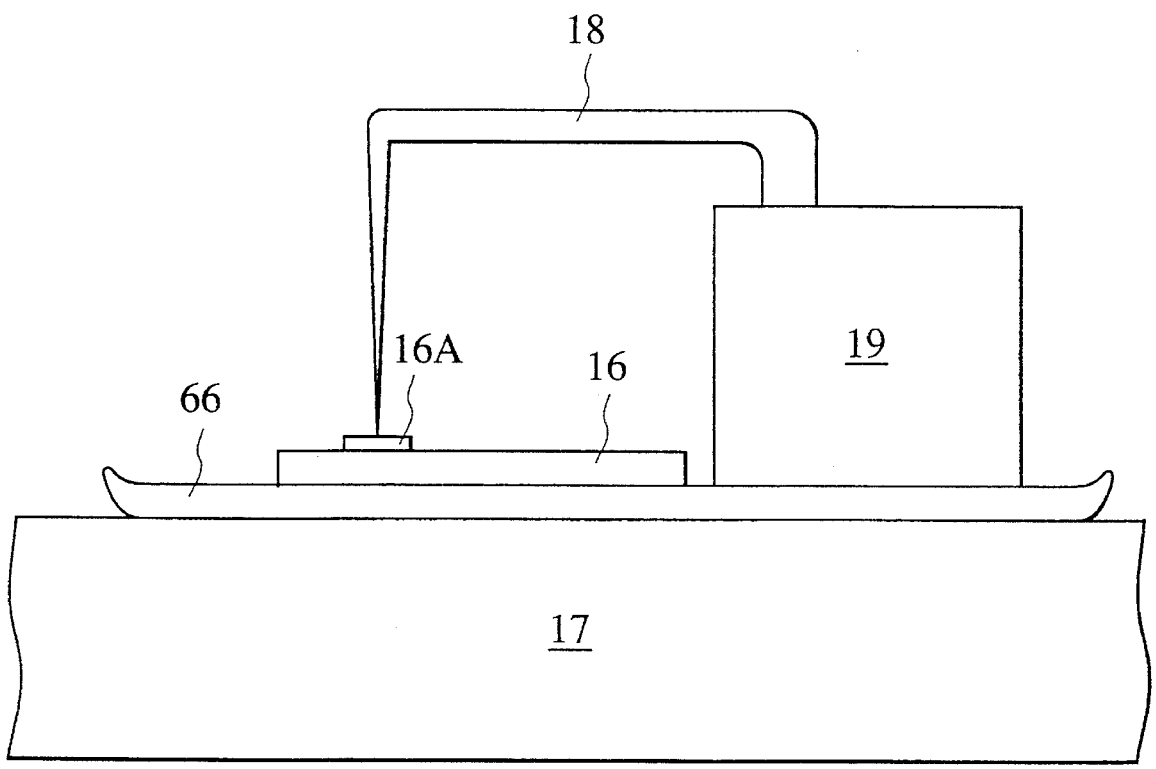
FIG. 8 shows a third embodiment of the present invention.

FIG. 8 shows the third embodiment of the present invention. A semiconductor wafer 16 is carried on a tray 66. A probe 18 and its drive unit 19 are disposed on the tray 66. The tray 66 may have an optional shape. The drive unit 19 may be a simple X-Y-Z manipulator. The probe 18 gets in contact with a required position on a micro pattern 16A formed on the wafer 16, and thereafter, the tray 66 is placed on a sample table 17 in a vacuum container 10. This embodiment is convenient because the probe 18 gets in contact with the micro pattern 16A outside the vacuum container 10.

The present invention is not limited to the first to third embodiments. Although the acceleration voltage applied to emit an electron beam is 1000 V in the embodiments, it may be optionally set according to the incident energy dependency of a secondary electron generation ratio and resolution. It may be 800 V or below, to prevent a low-level charge-up phenomenon. It may be 3 KV, 5 KV, 30 KV, or over to provide higher resolution. Since the present invention effectively prevents the charge-up phenomenon, the acceleration voltage applied to emit an electron beam can be freely set. In the first embodiment, it is possible to apply positive potential to the probe 18, to cancel negative charges caused by electron beams. The probe 18 may be brought in contact with the micro pattern 16A in a period between t01 and t02 in FIG. 6 before scanning. Thereafter, the probe 18 is separated from the micro pattern 16A, and the electron beam VM scans the micro pattern 16A. Then, the probe 18 is made in contact with the micro pattern 16A in a period between t1 and t2, in a period between t3 and t4, in a period between t5 and 56, and so on. This technique is more effective than the first embodiment in preventing the charge-up phenomenon. The present invention causes no charge-up phenomenon even at an acceleration voltage of 50 KV, thereby achieving high resolution to correctly measure the sizes of submicron patterns and nanometer patterns.

Various modifications will become possible for those skilled in the art after receiving the teachings of the present disclosure without departing from the scope thereof.

What is claimed is:

1. A micro-pattern measuring apparatus for transversely scanning a measurement object with an electron beam, to measure the size of the object without causing a surface contamination of the object and without deforming a microstructure of the object, comprising:

(a) an electron gun for emitting an electron beam toward the object;

(b) an electron optical system for periodically deflecting the electron beam, to scan the object;

(c) detection means for detecting a secondary electron signal generated by the object in response to the electron beam;

(d) measurement means for measuring the size of the object according to the secondary electron signal; and (e) a conductive probe for catching charged electrons on the object, the probe being arranged in a predetermined space relation as to the position of a scanning line of the electron beam on a surface of the object.

2. The apparatus according to claim 1, further comprising:

a direct-current power source for applying positive potential to said probe.

3. The apparatus according to claim 2, wherein said probe is spaced from the object by a predetermined distance.

4. The apparatus according to claim 3, wherein said predetermined distance is 30 micrometers, and said positive potential is 5000 V.

5. The apparatus according to claim 1, wherein said probe is in contact with the object.

6. The apparatus according to claim 1, wherein said probe contacts the object when the object is not scanned with the electron beam.

7. The apparatus according to claim 1, further comprising: a drive unit for moving said probe.

8. The apparatus according to claim 7, wherein the object is a micro pattern formed on a semiconductor substrate, and the drive unit with said probe and the semiconductor substrate are arranged on a tray.

9. The apparatus according to claim 1, wherein said measurement means is a cathode ray tube (CRT) to observe a waveform of a detected secondary electron signal.

10. The apparatus according to claim 9, wherein said electron beam is scanned several times on the surface of the object, and an integration of the several times of the scanning is displayed on the CRT.

11. A micro-pattern measuring apparatus for transversely scanning a measurement object with an electron beam, to measure the size of the object without causing a surface contamination of the object and without deforming a microstructure of the object, comprising:

(a) an electron gun for emitting an electron beam toward the object;

(b) an electron optical system for periodically deflecting the electron beam to scan the object;

(c) detection means for detecting a secondary electron signal generated by the object in response to the electron beam;

(d) measurement means for measuring the size of the object according to the secondary electron signal; and (e) a conductive probe for catching charged electrons on the object, the probe being arranged in a predetermined time relation as to the scanning period of the electron beam on a surface of the object.

12. The apparatus according to the claim 11, wherein said probe is movable according to said predetermined time relation.

13. The apparatus according to claim 12, further comprising a drive unit for moving said probe, according to said predetermined time relation.

14. The apparatus according to claim 13, wherein the object is a micro pattern formed on a semiconductor substrate, and the drive unit with said probe and the semiconductor substrate are arranged on a tray.

15. The apparatus according to claim 11, wherein said electron beam is scanned several times on a predetermined scan line, and said probe is in contact with the object only when the scanning of the electron beam is in a quiescent period between successive scan pulses.

16. The apparatus according to claim 11, further comprising:

a direct-current power source for applying positive potential to said probe.

17. The apparatus according to claim 16, wherein the distance between said probe and the object is different according to said predetermined time relation.

18. The apparatus according to claim 16, wherein the distance between said probe and a scanning line of said electron beam on the surface of the object is different according to said predetermined time relation.

19. The apparatus according to claim 18, wherein said electron beam is scanned several times on a predetermined scan line, and said distance is longer when the electron beam is irradiated on the scanning line in a scan pulse fashion than that when the scanning of the electron beam is in a quiescent period between the successive scan pulses.

20. The apparatus according to claim 11, wherein said measurement means is a cathode ray tube (CRT) to observe a waveform of a detected secondary electron signal, and said electron beam is scanned several times on the surface of the object, and an integration of the several times of the scanning is displayed on the CRT.

* * * * *